(12) United States Patent
Jeon et al.

(10) Patent No.: US 9,620,224 B2
(45) Date of Patent: Apr. 11, 2017

(54) SEMICONDUCTOR DEVICE AND OPERATING METHOD THEREOF

(71) Applicant: SK hynix Inc., Gyeonggi-do (KR)

(72) Inventors: Yoo Nam Jeon, Gyeonggi-do (KR); Keon Soo Shim, Gyeonggi-do (KR); Hae Soon Oh, Chungcheongbuk-do (KR); Bong Yeol Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 36 days.

(21) Appl. No.: 14/660,694

(22) Filed: Mar. 17, 2015

(65) Prior Publication Data

US 2016/0125946 A1    May 5, 2016

(30) Foreign Application Priority Data

Nov. 5, 2014   (KR) .................... 10-2014-0153087

(51) Int. Cl.
| | | |
|---|---|---|
| *G11C 16/14* | (2006.01) | |
| *G11C 16/28* | (2006.01) | |
| *G11C 16/04* | (2006.01) | |
| *G11C 16/10* | (2006.01) | |
| *G11C 16/30* | (2006.01) | |
| *G11C 16/34* | (2006.01) | |

(52) U.S. Cl.
CPC .......... *G11C 16/14* (2013.01); *G11C 16/0483* (2013.01); *G11C 16/10* (2013.01); *G11C 16/30* (2013.01); *G11C 16/3427* (2013.01)

(58) Field of Classification Search
CPC .............................. G11C 16/14; G11C 16/28
See application file for complete search history.

(56) References Cited

U.S. PATENT DOCUMENTS

| | | | | |
|---|---|---|---|---|
| 2011/0211392 A1* | 9/2011 | Kim | .................... | G11C 16/0408 365/185.2 |
| 2013/0322174 A1* | 12/2013 | Li | ...................... | G11C 16/0483 365/185.09 |
| 2014/0036599 A1 | 2/2014 | Mun | | |
| 2016/0111164 A1* | 4/2016 | Chen | ...................... | G11C 16/14 365/185.11 |

FOREIGN PATENT DOCUMENTS

| | | |
|---|---|---|
| KR | 1020100058166 | 6/2010 |
| KR | 1020110092523 | 8/2011 |

OTHER PUBLICATIONS

Office Action issued by the United States Patent and Trademark Office for a Continuation-In-Part U.S. Appl. No. 15/019,256 on Sep. 26, 2016.

* cited by examiner

*Primary Examiner* — Tri Hoang
(74) *Attorney, Agent, or Firm* — IP & T Group LLP (57) ABSTRACT

A semiconductor device includes a memory array including memory blocks, and an operation circuit suitable for performing a program loop and an erase loop on memory cells and selection transistors included in a selected memory block, wherein the operation circuit performs the program loop on the selection transistors so that a difference occurs between threshold voltages of the selection transistors and a target threshold voltage based on a difference between a cell current value of the selected memory block and a reference cell current value.

15 Claims, 8 Drawing Sheets

SEMICONDUCTOR DEVICE AND OPERATING METHOD THEREOF

CROSS-REFERENCE TO RELATED APPLICATION

The present application claims priority to Korean patent application number 10-2014-0153087, filed on Nov. 5, 2014, the entire disclosure of which is herein incorporated by in its entirety.

BACKGROUND

Field of Invention

Various exemplary embodiments relate generally to a semiconductor device and, more particularly, to a semiconductor device including a memory block, and an operating method thereof.

Description of Related Art

A semiconductor device includes a plurality of memory blocks. The plurality of memory blocks are arranged in line and have varying characteristics depending on their position in the semiconductor device.

Therefore, operating conditions may be set according to the characteristics of each of the memory blocks.

SUMMARY

An embodiment is directed to a semiconductor device capable of improving electrical characteristics by changing operating conditions for a memory block which is specified, and an operating method.

A semiconductor device according to an embodiment may include a memory array including memory blocks, and an operation circuit suitable for performing a program loop and an erase loop on memory cells and selection transistors included in a selected memory block, wherein the operation circuit performs the program loop on the selection transistors so that a difference occurs between threshold voltages of the selection transistors and a target threshold voltage based on a difference between a cell current value of the selected memory block and a reference cell current value.

A semiconductor device according to another embodiment may include a memory device including memory blocks, and a current measuring circuit suitable for measuring a cell current value of a selected memory block through bit lines, wherein the memory device performs a program loop on selection transistors so that a difference occurs between threshold voltages of the selection transistors included in the selected memory block and a target threshold voltage based on a difference between a cell current value of the selected memory block and a reference cell current.

A semiconductor device according to still another embodiment may include a memory array including memory blocks, an operation circuit suitable for performing a program loop on memory cells and selection transistors included in a selected memory block while changing program conditions for the memory cells and the selection transistors based on a compensation value, and a current measuring circuit suitable for determining the compensation value based on a reference cell current value and a cell current value of the selected memory block.

DETAILED DESCRIPTION

Hereinafter various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness of explanation. Like reference numerals refer to like elements throughout the specification and drawings.

Figure 1:
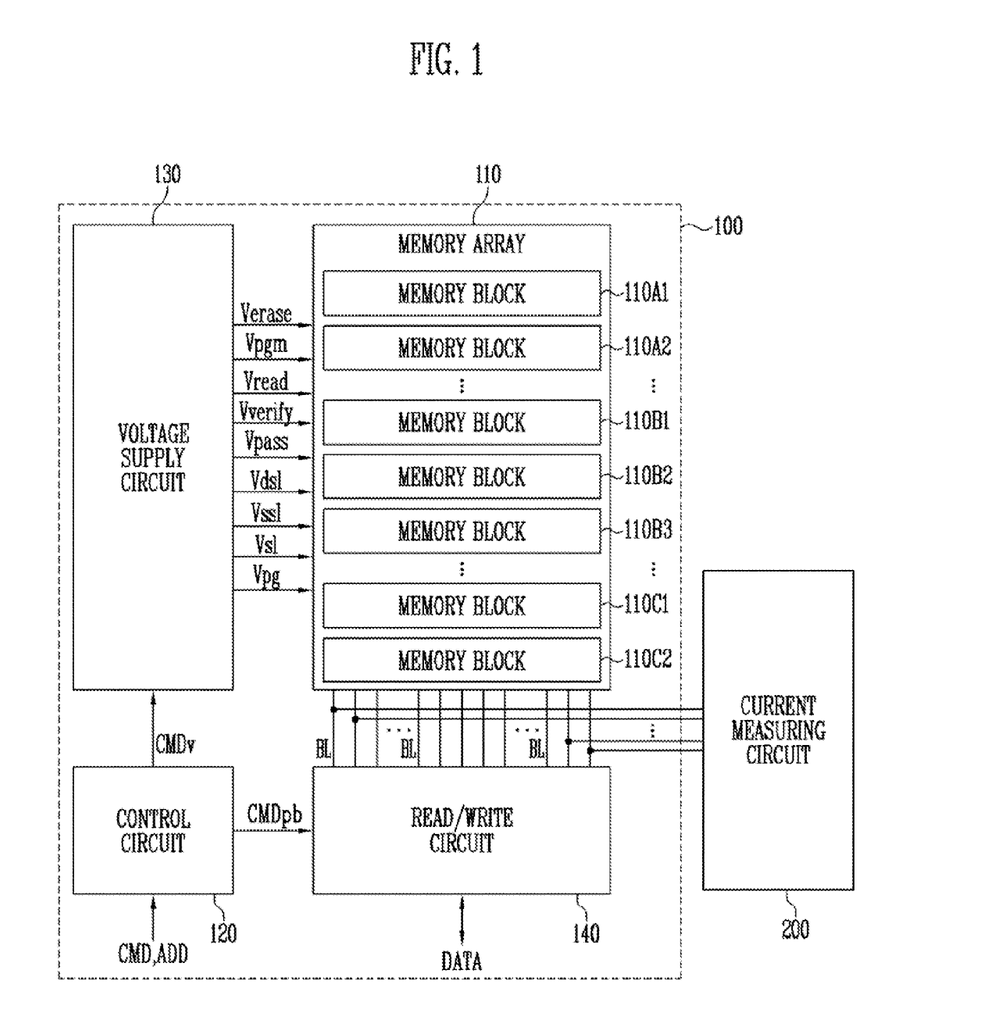
FIG. 1 is a block diagram illustrating a semiconductor device according to an embodiment.

FIG. 1 is a block diagram illustrating a semiconductor device according to an embodiment.

Referring to FIG. 1, the semiconductor device may include a memory device 100 and a current measuring circuit 200. The memory device 100 may include a memory array 110 and an operation circuit 120 to 140. The memory array 110 may include a plurality of memory blocks 110A1, 110A2, 110B1, 110B2, 110B3, 110C1, and 110C2. Each of the memory blocks 110A1 to 110C2 may include a plurality of memory strings. Each of the memory strings may include a plurality of memory cells. In a flash memory device, a memory block may include flash memory cells. For example, the memory block may include flash memory cells, each of which has a floating gate formed of polysilicon, or a charge storage layer including a nitride layer.

A memory block may include memory strings coupled to bit lines, respectively, and coupled in parallel with a common source line. The memory strings may include a two-dimensional (2D) structure or a three-dimensional (3D) structure over a semiconductor substrate. The structure of each memory block is described below in detail.

Figure 2A:
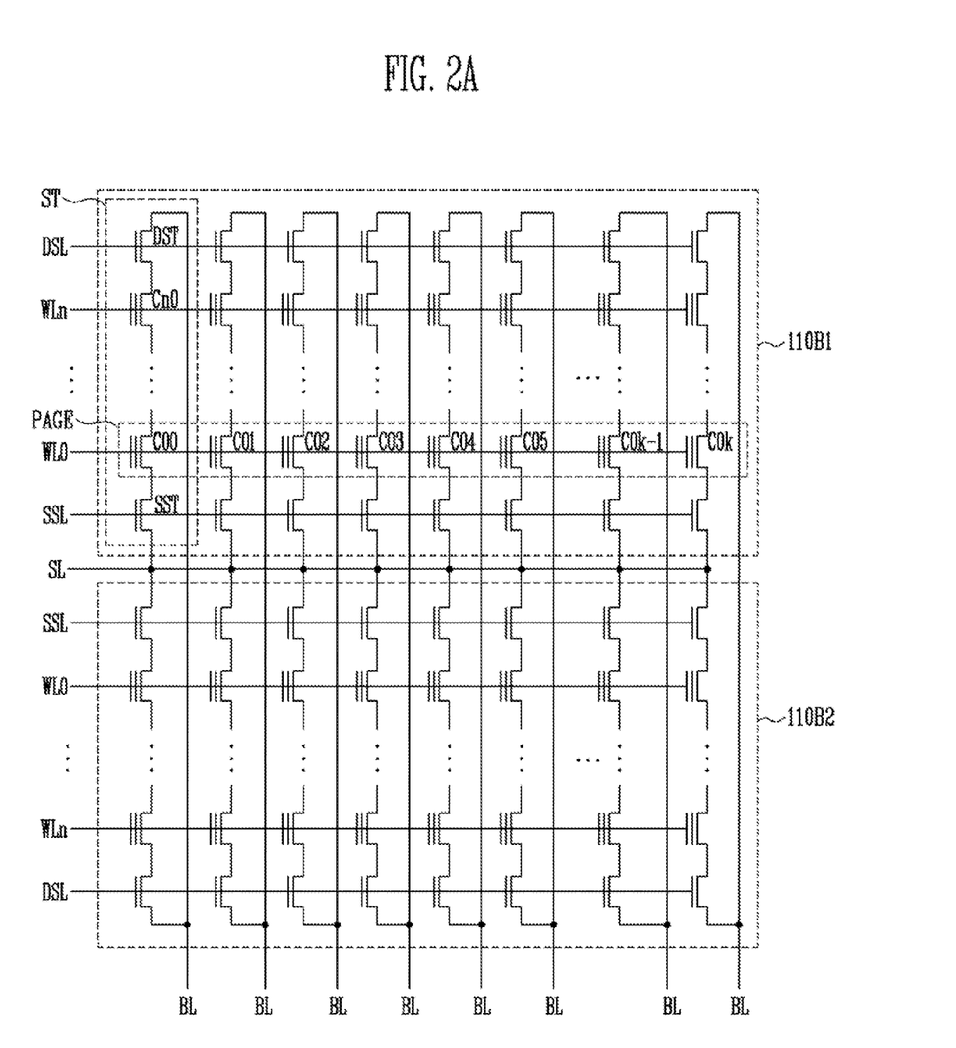
FIGS. 2A and 2B are views illustrating a memory block according to an embodiment.
Figure 2B:
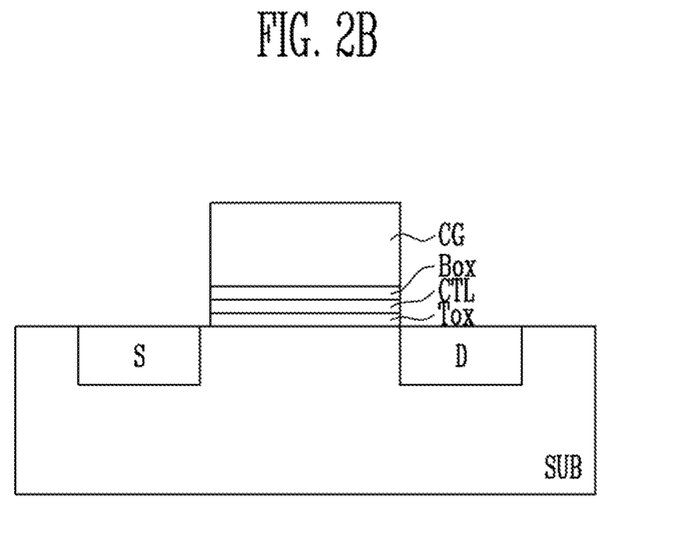

FIGS. 2A and 2B are views illustrating the memory blocks of FIG. 1 according to an embodiment. In detail, FIG. 2A is a circuit diagram illustrating the memory blocks 110B1 and 110B2 of FIG. 1, and FIG. 2B is a cross-sectional view illustrating any one of source and drain selection transistors SST and DST and a plurality of memory cells C00 to Cn0.

Referring to FIG. 2A, each of the memory blocks 110B1 and 110B2 may include a plurality of memory strings ST coupled between bit lines BL and a common source line SL. In other words, the memory strings ST may be coupled to the bit lines BL, respectively, and coupled in common to the common source line SL. Each of the memory strings ST may include a source selection transistor SST having a source coupled to the common source line SL, a cell string including a plurality of memory cells C00 to Cn0 coupled in series with each other, and a drain selection transistor DST having a drain coupled to the respective bit line BL. The memory cells C00 to Cn0 included in the cell string may be coupled in series between the source and drain selection transistors SST and DST. A gate of the source selection transistor SST may be coupled to a source selection line SSL, gates of the memory cells C00 to Cn0 may be coupled to word lines WL0 to WLn, respectively, and a gate of the drain selection transistor DST may be coupled to a drain selection line DSL.

The drain selection transistor DST may control connection or disconnection between the cell string and the bit line BL. The source selection transistor SST may control connection or disconnection between the cell string and the common source line SL.

In a NAND flash memory device, memory cells included in a memory cell block may be divided into physical page units or logical page units. For example, the memory cells C00 to C0$k$ coupled to a single word line, for example, word line WL0, may form a single physical page PAGE. In addition, even memory cells C00, C02, C04, and C0$k$-1 coupled to the word line WL0, may form an even page, and odd memory cells C01 C03, C05, and C0$k$ may form an odd page. Therefore, the even pages and odd pages may be the basic units for program operations and read operations.

Referring to FIG. 2B, the source and drain selection transistors SST and DST and the memory cells C00 to Cn0 may have substantially the same structure. More specifically, each of the selection transistors and the memory cells may have a silicon-oxide-nitride-oxide-silicon (SONOS) structure including a charge storage layer for led of a nitride layer.

In other words, the selection transistor may include a source S, a drain D, a tunnel insulating layer Tox, a charge storage layer CTL, a blocking insulating layer Box and a control gate CG. The source S and the drain D may be formed in a substrate SUB. The tunnel insulating layer Tox, the charge storage layer CTL, the blocking insulating layer Box and the control gate CG may be formed over the substrate SUB between the source S and the drain D. The charge storage layer CTL may include a nitride layer.

Figure 3A:
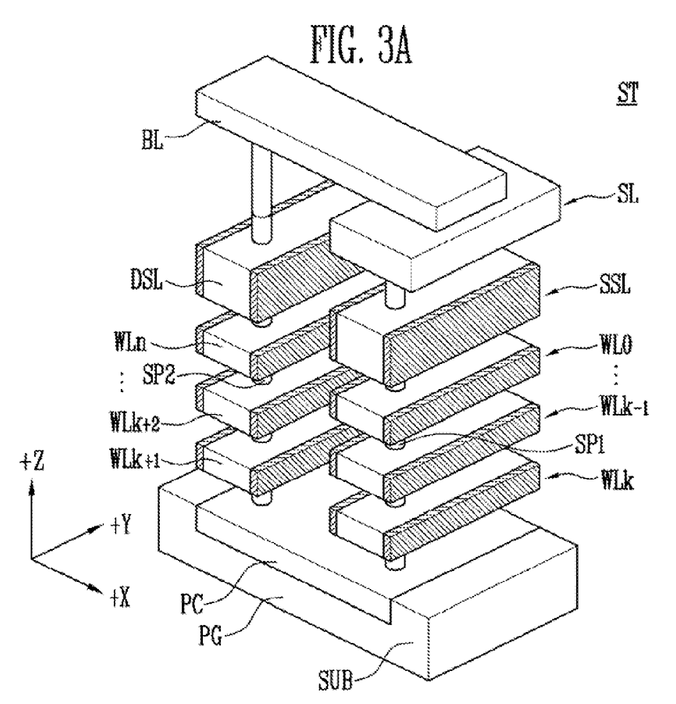
FIGS. 3A to 3C are views illustrating a memory block according to another embodiment.
Figure 3B:
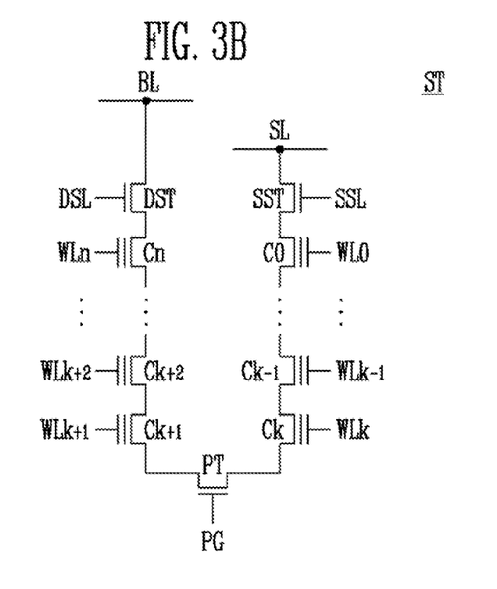
Figure 3C:
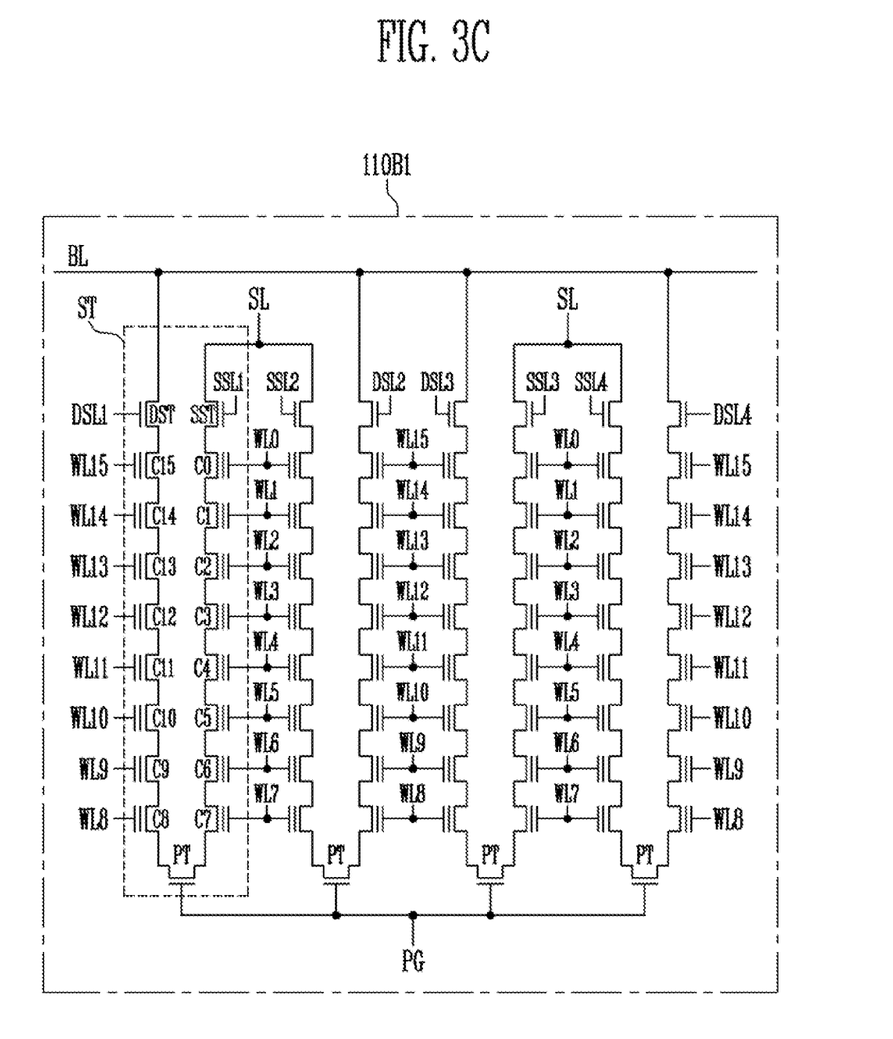

FIGS. 3A to 3C are views illustrating the memory blocks of FIG. 1 according to another embodiment. In detail, FIG. 3C is a circuit diagram illustrating the memory block 110B1 of FIG. 1, FIG. 3A is a perspective view illustrating a memory string ST included in the memory block 110B1 of FIG. 3C, and FIG. 3B is a circuit diagram illustrating the memory string ST of FIG. 3A, Referring to FIG. 3A, a pipe gate PG including a recessed portion may be formed in the semiconductor substrate SUB, and a pipe channel layer PC may be formed in the recessed portion of the pipe gate. PG. A plurality of vertical channel layers SP1 and SP2 may be formed on the pipe channel layer PC. A top portion of the first vertical channel layer SP1 of a pair of the vertical channel layers may be coupled to a common source line SL. A top portion of the second vertical channel layer SP2 may be coupled to a bit line BL. The vertical channel layers SP1 and SP2 may include polysilicon.

A plurality of conductive layers DSL and WLn to WLk+1 may be formed to surround the second vertical channel layer SP2 at different positions. A plurality of conductive layers SSL and WL0 to WLk may be formed to surround the first vertical channel layer SP1 at different positions. A multilayer film (not illustrated) including a charge storage layer may be formed on surfaces of the vertical channel layers SP1 and SP2 and a surface of the pipe channel layer PC. The multilayer film may also be formed between the vertical channel layers SP1 and SP2 and the conductive layers DSL, WLn to WLk+1 and SSL, WL0 to WLk and between the pipe channel layer PC and the pipe gate PG.

The uppermost conduct conductive layer surrounding the second vertical channel layer SP2 may be a drain selection line DSL, and lower conductive layers under the drain selection line DSL may be the word lines WLn to WLk+1. The uppermost conductive layer surrounding the first vertical channel layer SP1 may be a source selection line SSL, and lower conductive layers under the source selection line SSL may be the word lines WL0 to WLk. Some of the conductive layers serving as the word lines may be dummy word lines (not illustrated).

In other words, the first conductive layers SSL and WL0 to WLk and the second conductive layers DSL and WLn to WLk+1 may be stacked in different areas of the semiconductor substrate. The first vertical channel layer SP1, passing through the first conductive layers SSL and WL0 to WLk, may be coupled in a vertical direction to the substrate SUB between the source line SL and the pipe channel layer PC. The second vertical channel layer SP2, passing through the second conductive layers DSL and WLn to WLk+1, may be coupled in the vertical direction to the substrate SUB between the bit line BL and the pipe channel layer PC.

Referring to FIG. 3B, a drain selection transistor DST may be formed at a position in which the drain selection line DSL surrounds the second vertical channel layer SP2. Main cell transistors Cn to Ck+1 may be formed at positions in which the word lines WLn to WLk+1 surround the second vertical channel layer SP2, respectively. A source selection transistor SST may be formed at a position in which the source selection line SSL surrounds the first vertical channel layer SP1. Main cell transistors C0 to Ck may be formed at positions in which the word lines WL0 to WLk surround the first vertical channel layer SP1, respectively.

In the memory block having the above-described structure, the memory string ST may include the drain selection transistor DST and the main cell transistors Cn to Ck+1, which are coupled in the vertical direction to the substrate SUB between the bit line BL and the pipe channel layer PC, and the source selection transistor SST and the main cell transistors C0 to Ck, which are coupled in the vertical direction to the substrate SUB between the common source line CSL and the pipe channel layer PC. A dummy cell transistor (not illustrated) may be further coupled between the selection transistor DST or SST and the main cell transistors Cn or C0. A dummy cell transistor (not illustrated) may be further coupled between the main cell transistors Ck+1 or Ck and a pipe transistor PT.

The source selection transistor SST and the main cell transistors C0 to Ck, coupled between the common source line SL and the pipe transistor PT, may form a first vertical memory string. The drain selection transistor DST and the main cell transistors Cn to Ck+1, coupled between the bit line BL and the pipe transistor PT, may form a second vertical memory string.

Referring to FIG. 3C, the memory block 110B1 may include the plurality of memory strings ST coupled to the bit lines BL. In a P-BiCS structure, each of the memory strings ST may include the first vertical memory string SST and C0 to C7, coupled in the vertical direction between the common source line SL and the pipe transistor PT of the substrate, and the second vertical memory string C8 to C15 and DST, coupled in the vertical direction between the bit line BL and the pipe transistor PT of the substrate. The first vertical memory string SST and C0 to C7 may include the source selection transistor SST and the memory cells C0 to C7. The source selection transistor SST may be controlled in response to a voltage applied to a source selection line SSL1. The memory cells C0 to C7 may be controlled in response to a voltage applied to the stacked word lines WL0 to WL7. The second vertical memory string C8 to C15 and DST may include the drain selection transistor DST and the memory cells C8 to C15. The drain selection transistor DST may be controlled in response to a voltage applied to a drain selection line DSL1, and the memory cells C8 to C15 may be controlled in response to a voltage applied to the stacked word lines WL8 to WL15.

When the memory block 110B1 is selected, the pipe transistor PT, coupled between a pair of the memory cells C7 and C8 and located in the middle of a memory string having a P-BiCS structure, may electrically couple channel layers of the first vertical memory string SST and C0 to C7 and channel layers of the second vertical memory string C8 to C15 and DST, which are included in the selected memory block 110B1, to each other.

In a 2D structured memory block, each of the memory strings may be coupled to each of the bit lines, and drain selection transistors of a memory block may be controlled by a single drain selection line. However, in the 3D structured memory block 110B1, the plurality of memory strings ST may be coupled in common to each of the bit lines BL. The number of memory strings ST coupled to one of the bit lines BL and controlled by the same word lines in the same memory block 110B1 may be changed according to the purpose for the design, that is, to suit the particular objectives of the designer.

Since the plurality of memory strings ST are coupled in parallel with the single bit line BL, the drain selection transistors DST may be independently controlled in response to selection voltages applied to drain selection lines DSL1 to DSL4, to selectively couple the single bit line BL to the memory strings ST.

The memory cells C0 to C7 of the first vertical memory string SST and C0 to C7 and the memory cells C8 to C15 of the second vertical memory string C8 to C15 and DST, which are coupled in the vertical direction in the memory block 110B1, may be controlled in response to operating voltages applied to the stacked word lines WL0 to WL7 and the stacked word lines WL8 to WL15, respectively. The word lines WL0 to WL15 may be divided into memory block units.

The selection lines DSL and SSL and the word lines WL0 to WL15 may be local lines of the memory block 110B1. More specifically, the source selection line SSL and the word lines WL0 to WL7 may be local lines of the first vertical memory string, and the drain selection line DSL and the word lines WL8 to WL15 may be local lines of the second vertical memory string. Pipe gates PG of the pipe transistors PT in the memory block 110B1 may be commonly coupled.

Referring again to FIGS. 1 and 3B, the operation circuit 120 to 140 may perform a program loop, an erase loop and a read operation on a memory cell C0 coupled to a selected word fine, e.g., WL0. The program loop may include a program operation and a program verify operation. The erase loop may include an erase operation and an erase verify operation. The operation circuit 120 to 140 may perform a program operation (or post program operation) to control an erase level at which threshold voltages of the memory cells are distributed after the erase loop.

To perform the program loop, the erase loop and the read operation, the operation circuit 120 to 140 may selectively output the operating voltages to the local lines SSL, WL0 to WLn, PG, and DSL and the common source line SL of the selected memory block, control precharge/discharge of the bit lines BL, or sense current flow (or voltage variation) of the bit lines BL.

In a NAND flash memory, the operation circuit may include a control circuit 120, a voltage supply circuit 130 and a read/write circuit 140.

The control circuit 120 may control the voltage supply circuit 130 to generate operating voltages Verase, Vpgm, Vread, Vverify, Vpass, Vdsl, Vssl, Vsl, and Vpg with target levels to perform the program loop, the erase loop and the read operation in response to a command signal CMD, which is input from an external device, and apply the operating voltages to the local lines SSL, WL0 to WLn, PG, and DSL and the common source line SL of the selected memory block. The control circuit 120 may control the read/write circuit 140 to output a voltage control signal CMDv to the voltage supply circuit 130. In addition, the control circuit 120 may control precharge/discharge of the bit lines BL, in response to data to be stored to the memory cells, to perform the program loop, the erase loop and the read operation, or sense current flow (or voltage variations) on the bit lines BL during a read operation or a program verify operation. The control circuit 120 may output an operation control signal CMDpb to the read/write circuit 140.

The voltage supply circuit 130 may generate the operating voltages Verase, Vpgm, Vread Vverify, Vpass, Vdsl, Vssl, Vsl, and Vpg necessary to perform the program loop, the erase loop and the read operation on the memory cells in response to the voltage control signal CMDv from the control circuit 120. These operating voltages may include an erase voltage Verase, a program voltage Vpgm a read voltage Vread, a pass voltage Vpass, selection voltages Vdsl and Vssl, a common source voltage Vsl and a pipe gate voltage Vpg. In addition, the voltage supply circuit 130 may output the operating voltages to the local lines SSL, WL0 to WLn, PG, and DSL and the common source line SL of the selected memory block in response to a row address signal (not illustrated) from the control circuit 120.

The read/write circuit 140 may include a plurality of page buffers (not illustrated) coupled to the memory array 110 through the bit lines BL. More specifically, each of the page buffers may be coupled to each of the bit lines BL. In other words, the page buffers may be coupled to the bit lines BL in a one to one fashion. The page buffers may selectively precharge the bit lines BL in response to the operation control signal CMDpb from the control circuit 120 and the data DATA to be stored in the memory cells during a program operation. The page buffers may precharge the bit lines BL, sense voltage variations or current on the bit lines BL, and latch data read from the memory cells in response to the operation control signal CMDpb from the control circuit 120 during a program verify operation or a read operation.

The current measuring circuit 200 may be coupled to the bit lines BL of the memory device 100, and coupled to the memory blocks 110A1, 110A2, 110B1, 110B2, 110B3, 110C1, and 110C2 of the memory array 110 through the bit lines BL. The current measuring circuit 200 may be coupled to the bit lines BL to determine a reference cell current value of the memory blocks or a cell current value of the selected memory block. The current measuring circuit 200 may be included in an external device which is separable from the memory device 100.

The current measuring circuit 200 may measure the cell current value by sensing the amount of current flowing from the bit line BL to the common source line SL. The operation circuit 120 to 140 of the memory device 100 may apply a first positive voltage of, for example, 0.9V to the bit lines BL, a ground voltage of, for example, 0V to the common source line SL, and a second positive voltage of, for example, 5V to the memory cells and the selection transistors when the memory cells and the selection transistors are in an erased state, so that the current measuring circuit 200 may measure the cell current value.

The current measuring circuit 200 may calculate the reference cell current value based on the cell current values measured from the plurality of memory blocks.

An operating method of a semiconductor device according to an embodiment is described below.

Figure 4:
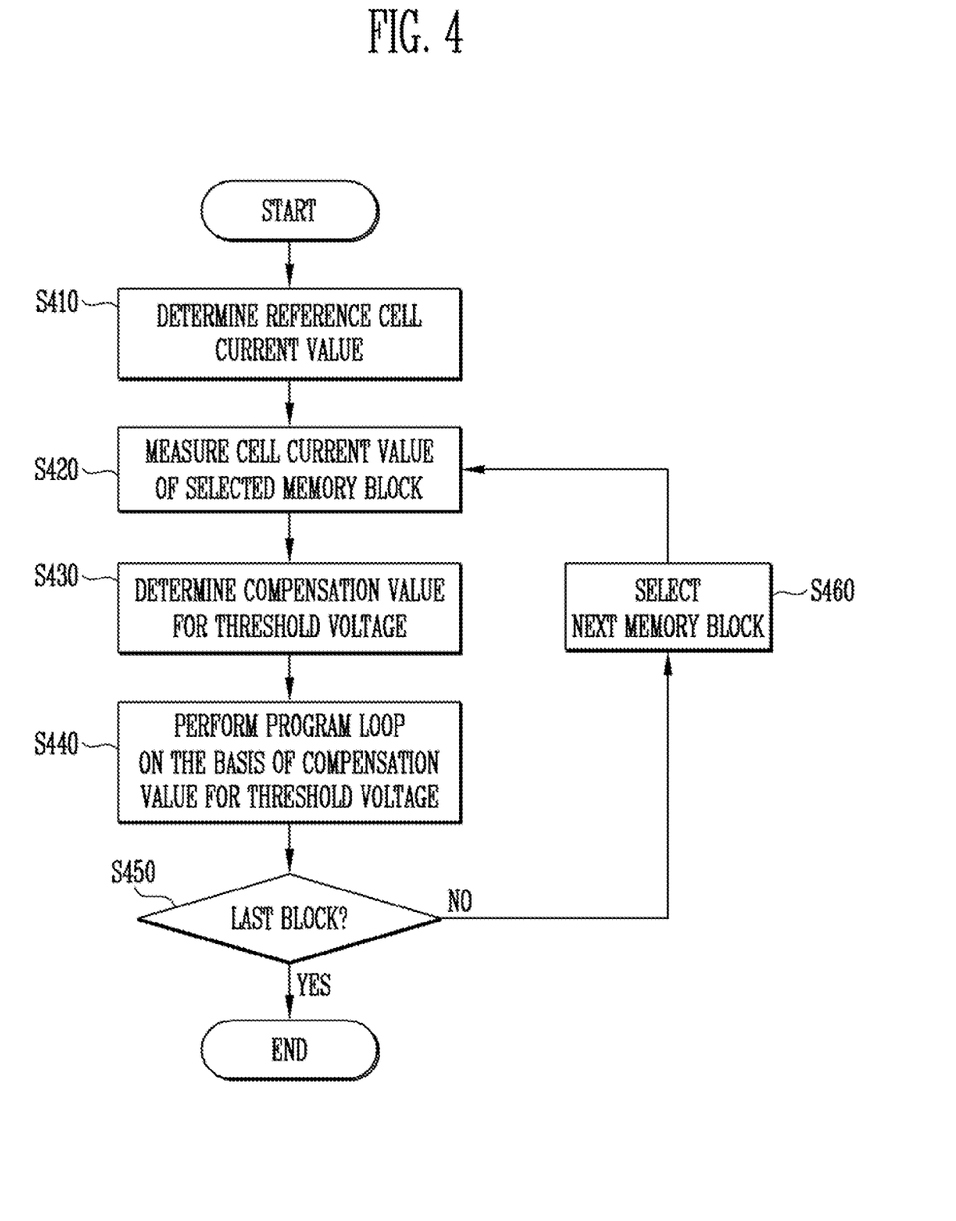
FIG. 4 is a flowchart illustrating an operating method of a semiconductor device according to an embodiment.

FIG. 4 is a flowchart illustrating an operating method of a semiconductor device according to an embodiment.

Referring to FIGS. 1 and 4, a reference cell current value may be determined at step S410. The reference cell current value may be determined by the current measuring circuit 200. To determine the reference cell current value, the current measuring circuit 200 may measure cell current values from the memory blocks 110B1 to 110B3, located in the middle of the memory array 110, through the bit lines BL.

The operation circuit 120 to 140 of the memory device 100 may apply the operating voltages to the selected memory block 110B1 so that the current measuring circuit 200 may measure the cell current value of the selected memory block 110B1. For example, the operation circuit 120 to 140 may apply the first positive voltage of, for example, 0.5V to 1.5V to the bit lines BL of the selected memory block 11061, the ground voltage of, for example, 0V to the common source line, and the second positive voltage of, for example, 4.5V to 5.5V to word lines of the memory cells and selection lines of the selection transistors. The current measuring circuit 200 may measure the amount of current, i.e., the cell current value, flowing from the bit line BL to the common source line.

By using substantially the same method, cell current values of the remaining memory blocks 110B2 and 110B3, located in the middle of the memory cell array 110, may be measured. The number of memory blocks selected to determine the reference cell current value may vary. The reference cell current value may be determined based on the measured cell current values. For example, an average value of the cell current values may be the reference cell current value.

A cell current value of the selected memory block may be measured at step S420. A difference between the measured cell current value and the reference cell current value may be checked, and program conditions for the selection transistors or the memory cells may be changed to reflect the difference. The cell current value may be measured when the memory cells and the selection transistors included in the memory block are in an erase state in which threshold voltages are approximately 2V.

For example, when the first memory block 110A1 is selected, the operation circuit 120 to 140 may apply the first positive voltage of, for example, 0.5V to 1.5V to the bit lines BL of the selected memory block 110A1 the ground voltage of, for example, 0V to the common source line, and the second positive voltage of, for example, 4.5V to 5.5V to the word lines of the memory cells and the selection lines of the selection transistors. The current measuring circuit 200 may measure the amount of current, i.e., the cell current value, flowing from the bit line BL to the common source line.

A compensation value for a threshold voltage may be determined at step S430. For example, the current measuring circuit 200 may determine the compensation value based on the reference cell current value, which is determined by the current measuring circuit 200 at S410, and the cell current value which is measured from the selected memory block 110A1 at S420.

A program loop may be performed on the basis of the compensation value for the threshold voltage at step S440. More specifically, for example, the operation circuit 120 to 140 may perform the program loop on the selection transistor so that the difference may occur between the threshold voltage of the selection transistor and a target threshold voltage based on the difference between the cell current value measured from the selected memory block 110A1 and the reference cell current value. Information about the compensation value may be provided to the memory device 100, e.g., the control circuit 120. The control circuit 120 may control the voltage supply circuit 130 and the read/write circuit 140 based on the information relating to the compensation value. For example, when a program verify operation is performed after a program operation, a precharge level of the bit line BL or sensing conditions of a bit line voltage may be changed based on the compensation value.

The operation circuit 120 to 140 may perforin a program operation on the drain selection transistor, or a program loop on the drain selection transistor and the source selection transistor based on the compensation value. In addition, when performing the program loop on the memory cells, the operation circuit 120 to 140 may change conditions for the program loop of the memory cells based on the compensation value. The compensation value of each memory block may be stored in a predetermined memory block.

When the measured cell current value is greater than the reference cell current value, a program loop may be performed on the selection transistor to reduce a threshold voltage of the selection transistor less than the target threshold voltage. On the other hand, when the cell current value is greater than the reference cell current value, the program loop may be performed on the selection transistor so that the threshold voltage of the selection transistor may be greater than the target threshold voltage.

Cell current values of the memory blocks 110A1, 110A2, 110C1 and 110C2 located at the edge of the memory array may be lower than that those of the memory blocks 110B1 to 110B3 at the center thereof. Therefore, threshold voltages of selection transistors included in the memory blocks 110A1, 110A2, 110C1, and 110C2 having the lower cell current values may be increased. Although the threshold voltages thereof are increased, operating characteristics thereof may be the same as those of the memory blocks 110B1 to 110B3 located in the middle of the memory array 110, and leakage current characteristics may be improved so that program disturbance characteristics of the memory blocks 110A1, 110A2, 110C1, and 110C2 may be improved.

Whether the selected memory block 110A1 is the last block may be determined at step S450. At step S460, the next memory block 110A2 may be selected when the selected memory block 110A1 is not the last memory block. Subsequently, steps S420 to S440 may be carried out as described above to perform a program loop on selection transistors included in the selected memory block 110A2. The operation may be terminated when a program loop is performed on selection transistors included in all memory blocks based on the compensation value.

As described above, by changing conditions for a program loop on memory blocks based on a compensation value, uniform electrical characteristics may be obtained, and operational reliability may be improved.

Figure 5:
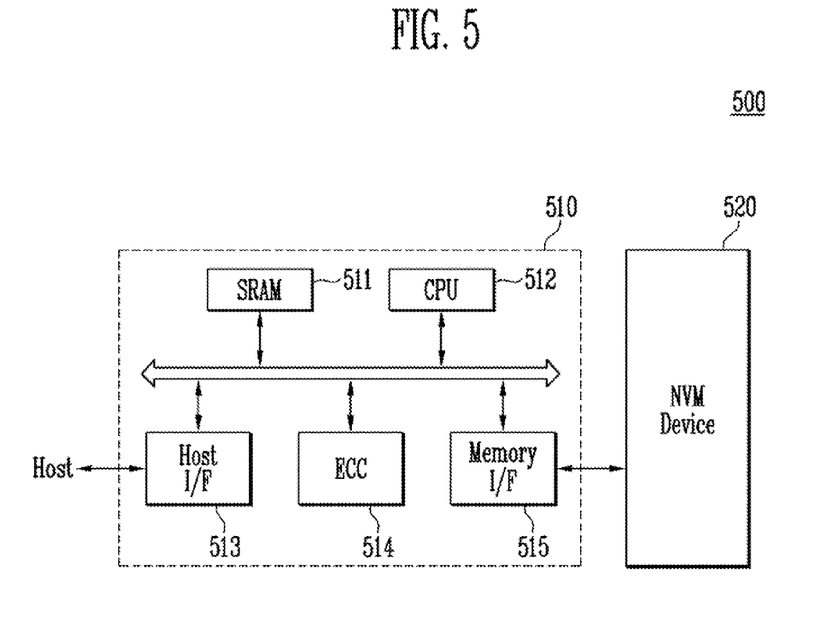
FIG. 5 is a schematic block diagram of a memory system according to an embodiment

FIG. 5 is a schematic block diagram illustrating a memory system 500 according to an embodiment.

Referring to FIG. 5, the memory system 500 may include a non-volatile memory device 520 and a memory controller 510.

The non-volatile memory device 520 may correspond to the semiconductor device described above with reference to FIG. 1. The memory controller 510 may control the non-volatile memory device 520. The memory device 500 including the non-volatile memory device 520 and the memory controller 510 may be used as a memory card or a solid state disk/drive (SSD). An SRAM 511 may be used as an operation memory of a processing unit 512. A host interface 513 may include a data exchange protocol of the host coupled to the memory system 500. An error correction block 514 may check and correct an error in data read from the non-volatile memory device 520. A memory interface 514 may interface with the non-volatile memory device 520. The processing unit 512 may perform a control operation for data exchange.

The memory system 500 may further include a ROM (not shown) for storing code data for interfacing with the host and so on. The non-volatile memory device 520 may be provided in a multi-chip package including flash memory chips. The memory system 500 according to an embodiment may be used as a storage medium having low error probability, i.e. high reliability. The flash memory device may be used in a memory system such as the SSD. The memory controller 510 may communicate with an external device, e.g. a host, through one of various interface protocols such as USB, MMC, PCI-E, SATA, PATA, SCSI, ESDI and IDE, etc.

Figure 6:
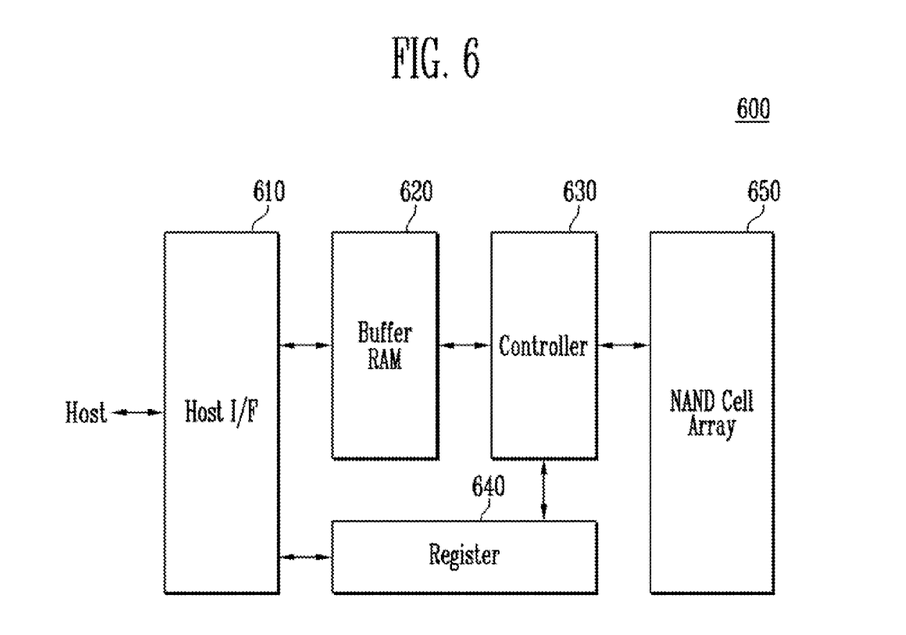
FIG. 6 is a schematic block diagram of a fusion memory device or a fusion memory system performing program operation according to the earlier described various embodiments.

FIG. 6 is a schematic block diagram illustrating a fusion memory device or a fusion memory system for performing a program operation. For example, the present invention may be applied to a OneNAND flash memory device 600 as the fusion memory device.

The OneNAND flash memory device 666 may include a host interface 610 for exchanging information with a device using different protocols; a buffer RAM 620 for embedding code for driving the memory device or storing data; a controller 630 for controlling reading, programming, and every state in response to a control signal and a command inputted from an external device; a register 640 for storing data such configurations for defining commands, addresses, and system operation environments in the memory device; and a NAND cell array 650 having an operation circuit including a non-volatile memory cell and a page buffer. The OneNAND flash memory device 600 may program data based on a general method in response to a write request from the host.

Figure 7:
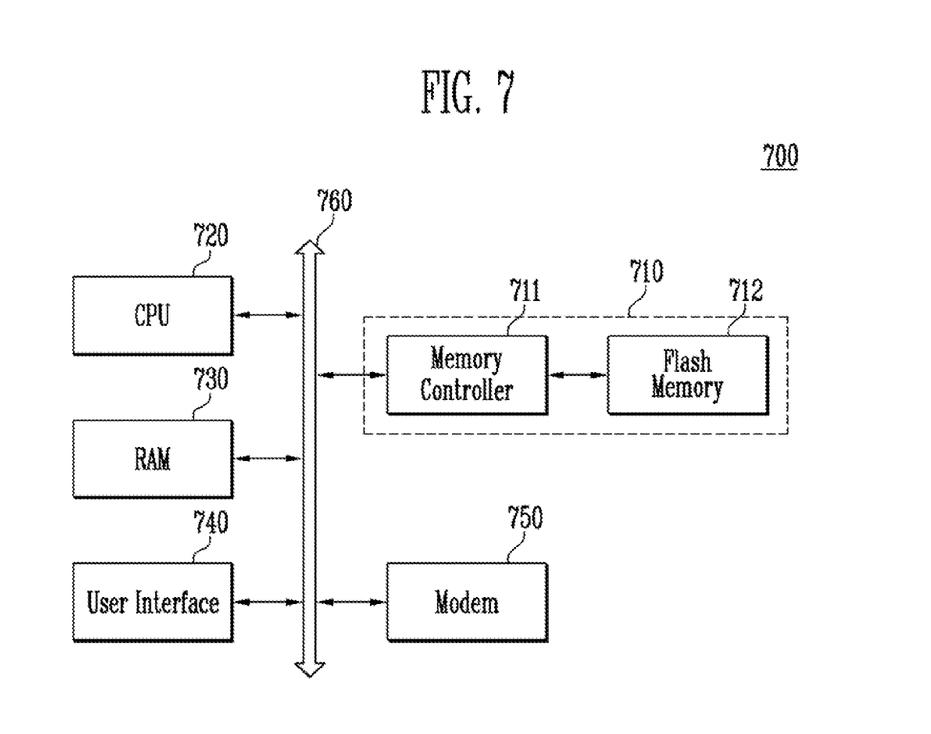
FIG. 7 is a schematic block diagram of a computing system including a flash memory device according to an embodiment.

FIG. 7 is a schematic view illustrating a computing system including a flash memory 712 according to an embodiment of the present invention.

The computing system 700 according to the embodiment may include a microprocessor 720 electrically connected to a system bus 760, a RAM 730, a user interface 740, a modem 750 such as a baseband chipset, and a memory system 710. In case that the computing system 700 is a mobile device, a battery (not shown) for supplying an operation voltage of the computing system 700 may be further provided. The computing system 700 according to the embodiment, may further include an application chipset, a camera image processor CIS, a mobile DRAM, etc. The memory system 710 may include an SSD using a non-volatile memory for storing data. The memory system 710 may be applied to a fusion flash memory, e.g. a OneNAND flash memory.

According to the embodiments, electrical characteristics may be improved by changing operating conditions for a memory block which is specified.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device comprising:
a memory array including memory blocks;
an operation circuit suitable for performing a program loop and an erase loop on memory cells and selection transistors included in a selected memory block; and
a current measuring circuit suitable for determining a reference cell current value,
wherein the operation circuit performs the program loop on the selection transistors so that a difference occurs between threshold voltages of the selection transistors and a target threshold voltage based on a difference between a cell current value of the selected memory block and the reference cell current value,
wherein the current measuring circuit determines the reference cell current value by measuring cell current values from the memory blocks located in a middle of the memory array through bit lines.

2. The semiconductor device of claim 1, wherein the operation circuit performs the program loop after performing the erase loop on the selection transistors.

3. The semiconductor device of claim 1, wherein the operation circuit performs the program loop on the selection transistors in a sequential manner from a first memory block to a last memory block after the reference cell current value is determined.

4. The semiconductor device of claim 1, wherein the current measuring circuit is suitable for measuring the cell current value of the selected memory block through the bit lines.

5. The semiconductor device of claim 1, wherein the operation circuit is suitable for applying operating voltages to the selected memory block when the current measuring circuit measures the cell current value of the selected memory block.

6. The semiconductor device of claim 5, wherein the operation circuit is suitable for applying a first positive voltage to bit lines of the selected memory block, applying a ground voltage to a common source line, and applying a second positive voltage to the memory cells and the selection transistors.

7. The semiconductor device of claim 1, wherein the selection transistors include a drain selection transistor coupled to a bit line and a source selection transistor coupled to a common source line, and
the operation circuit performs the program loop on the drain selection transistor based on the difference between the cell current value and the reference cell current value.

8. The semiconductor device of claim 1, wherein each of the selection transistors includes a charge storage layer that includes a nitride layer.

9. A semiconductor device comprising:
a memory device including memory blocks; and
a current measuring circuit suitable for measuring a cell current value of a selected memory block through bit lines, wherein the memory device performs a program loop on selection transistors so that a difference occurs between threshold voltages of the selection transistors included in the selected memory block and a target threshold voltage based on a difference between the cell current value of the selected memory block and a reference cell current, wherein the current measuring circuit determines a reference cell current value by measuring cell current values from the memory blocks located in a middle of the memory array through the bit lines.

10. The semiconductor device of claim 9, wherein the memory device performs the program loop on the selection transistors in a sequential manner from a first memory block to a last memory block after the reference cell current value is determined.

11. The semiconductor device of claim 9, wherein the memory device is suitable for applying a first positive voltage to the bit lines of the selected memory block, applying a ground voltage to a common source line, and applying a second positive voltage to the memory cells and the selection transistors when the current measuring circuit measures the cell current value of the selected memory block.

12. The semiconductor device of claim 9, wherein the selection transistors include a drain selection transistor coupled to the bit line and a source selection transistor coupled to a common source line, the memory device performs the program loop on the drain selection transistor based on the difference between the cell current value and the reference cell current value.

13. The semiconductor device of claim 9, wherein each of the selection transistors includes a charge storage layer that includes a nitride layer.

14. A semiconductor device comprising:
a memory array including memory blocks;
an operation circuit suitable for performing a program loop on memory cells and selection transistors included in a selected memory block while changing program conditions for the memory cells and the selection transistors based on a compensation value; and
a current measuring circuit suitable for determining the compensation value based on a reference cell current value and a cell current value of the selected memory block,
wherein the current measuring circuit determines the reference cell current value by measuring cell current values from memory blocks located in a middle of the memory array through bit lines.

15. The semiconductor device of claim 14, wherein the current measuring circuit measures the cell current value when the memory cells and the selection transistors included in the selected memory block are in an erased state.

* * * * *